(12) United States Patent
Khailany et al.

(10) Patent No.: US 8,879,350 B2
(45) Date of Patent: Nov. 4, 2014

(54) SYSTEM AND METHOD FOR TUNING A SUPPLY VOLTAGE FOR DATA RETENTION

(71) Applicant: NVIDIA Corporation, Santa Clara, CA (US)

(72) Inventors: Brucek Kurdo Khailany, San Francisco, CA (US); Brian Matthew Zimmer, Berkeley, CA (US)

(73) Assignee: NVIDIA Corporation, Santa Clara, CA (US)

( * ) Notice: Subject to any disclaimer, the term of this patent is extended or adjusted under 35 U.S.C. 154(b) by 27 days.

(21) Appl. No.: 13/672,616

(22) Filed: Nov. 8, 2012

(65) Prior Publication Data

US 2014/0126275 A1 May 8, 2014

(51) Int. Cl.
 *G11C 11/413* (2006.01)
 *G11C 14/00* (2006.01)
(52) U.S. Cl.
 CPC .................. *G11C 14/0054* (2013.01)
 USPC .............. 365/228; 365/154; 365/189.12
(58) Field of Classification Search
 USPC ................. 365/154, 189.12, 228
 See application file for complete search history.

(56) References Cited

U.S. PATENT DOCUMENTS

| 2005/0268203 | A1* | 12/2005 | Keays et al. | 714/758 |
| 2012/0182792 | A1* | 7/2012 | Cheng et al. | 365/154 |
| 2012/0324314 | A1* | 12/2012 | Seshadri et al. | 714/773 |

OTHER PUBLICATIONS

Micheloni. R. et al., "A 4Gb 2b/cell NAND Flash Memory with Embedded 5b BCH ECC for 36MB/s System Read Throughput," IEEE International Solid-State Circuits Conference, Session 7, Non-Volatile Memory, 7.6, Feb. 6, 2006, pp. 497-506.
Hocquenghem, A., "Codes correcteurs d'erreurs," Chiffers, 1959, vol. 2, pp. 147-156.
Bose, R. C. et al., "On A Class of Error Correcting Binary Group Codes," Information and Control, Mar. 1960, vol. 3, pp. 68-79.
Berlekamp, E. R., "Factoring Polynomials Over Finite Fields," The Bell System Technical Journal, Oct. 1967, pp. 1853-1859.
Chien, R. T., "Cyclic Decoding Procedures for the Bose-Chaudhuri-Hocquenghem Codes," IEEE Transactions on Information Theory, Oct. 1964, pp. 357-363.
Qin, H. et al., "Error-Tolerant SRAM Design for Ultra-Low Power Standby Operation," 9th International Symposium on Quality Electronic Design, 2008, pp. 30-34.
Naseer, R., "DEC ECC Design to Improve Memory Reliability in Sub-100nm Technologies," IEEE, 2008, pp. 586-589.

* cited by examiner

*Primary Examiner* — Hoai V Ho
*Assistant Examiner* — Jay Radke
(74) *Attorney, Agent, or Firm* — Zilka-Kotab, PC

(57) ABSTRACT

A processor and a system are provided for tuning a supply voltage for data retention. The contents of data storage circuitry are read and a data verification indication corresponding to the contents is computed. Then, the supply voltage provided to the data storage circuitry is reduced to a low voltage level that is intended to retain the contents of the data storage circuitry.

20 Claims, 9 Drawing Sheets

US 8,879,350 B2

SYSTEM AND METHOD FOR TUNING A SUPPLY VOLTAGE FOR DATA RETENTION

This invention was made with Government support under Agreement No. HR0011-10-9-0008, awarded by DARPA. The Government has certain rights in the invention.

FIELD OF THE INVENTION

The present invention relates to storage circuits, and, more specifically to data retention.

BACKGROUND

Processors used in smartphones, tablets, laptops, and other mobile devices enter sleep modes to reduce power consumption and extend the time between battery recharging. When a sleep mode is entered, the power supply to circuitry is temporarily disconnected from the power network by "gating off" the circuitry. When the sleep mode is exited, the power supply is restored to the circuitry by disabling the "gating off" and reconnecting the circuitry to the power network.

When the power supply is disconnected from storage circuitry such as static random access memory (SRAM), the data stored in the SRAM is typically not retained. Therefore, power gating is sometimes not applied to storage circuitry so that the data is retained through the sleep mode and can be read after the sleep mode is exited. In other situations, the data stored in an on-chip SRAM is saved to external memory prior to entering the sleep mode and the data is restored to the on-chip SRAM from the external memory after the sleep mode is exited. The save and restore approach has latency and power overhead which may cause that approach to be deemed unacceptable when the amount of time spent in the sleep mode is short. Thus, there is a need for addressing the issue of data retention and/or other issues associated with the prior art.

SUMMARY

A system and method are provided for tuning a supply voltage for data retention. The contents of data storage circuitry are read and a data verification indication corresponding to the contents is computed. Then, the supply voltage provided to the data storage circuitry is reduced to a low voltage level that is intended to retain the contents of the data storage circuitry.

DETAILED DESCRIPTION

As previously explained, when the power supply is disconnected from storage circuitry such as SRAM, the data stored in the SRAM is typically not retained. Therefore, power gating is not a reliable technique for ensuring that data is retained through a low-power mode, such as a sleep mode. If data storage is necessary, an alternate technique of storing the contents of the SRAM to external memory prior to entering the sleep mode and later restoring the contents to the on-chip SRAM from the external memory is effective when the amount of time spent in the sleep mode is long. Because writing and reading external memory can consume more energy compared with simply retaining the contents of the SRAM over a short time period by maintaining the normal operating voltage level, the amount of time spent in the sleep mode should be several times longer than the time needed to perform the storing and restoring. Otherwise, the energy consumed by the saving and restoring operations may exceed the energy saved during the sleep mode.

An alternative to the save and restore approach that may be employed for short sleep-mode use cases is to lower the supply voltage to the minimum voltage needed to retain state in on-chip storage elements (SRAMs, latches, and flip flops), a so-called low-voltage retention mode. Since leakage current has a strong dependence on supply voltage, the approach is very effective at reducing energy. However, one challenge with this approach is determining the minimum safe voltage for data retention, particularly with SRAMs, because the minimum safe voltage is very dependent on device variation in individual SRAM cells.

Figure 1A:
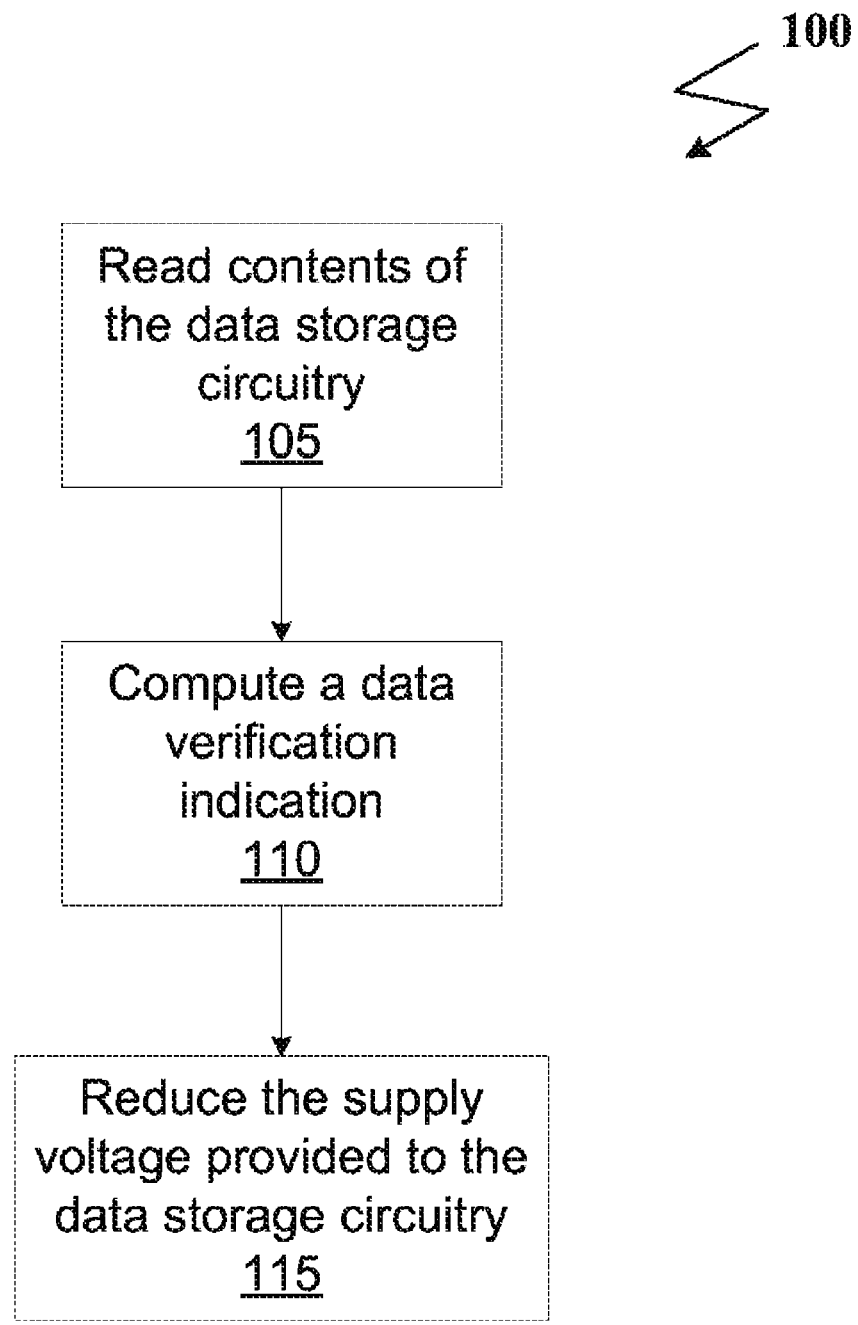
FIG. 1A illustrates a flowchart of a method for entering a low-voltage retention mode, in accordance with one embodiment.

FIG. 1A illustrates a flowchart of a method 100 for entering a low-voltage retention mode, in accordance with one embodiment. At step 105, the contents of data storage circuitry are read. At step 110, a data verification indication corresponding to the contents is computed. In one embodiment, the entire contents of the data storage circuitry is read and used to compute the data verification indication. The number of bits representing the data verification indication may be less than the number of bits stored in the data storage circuitry. Then, at step 115, the supply voltage provided to the data storage circuitry is reduced to a low voltage level that is intended to retain the contents of the data storage circuitry.

Determination of the minimum voltage level for which the entire contents of the data storage circuitry are retained is challenging. The minimum voltage level may vary from one integrated circuit device to another and even from each bit of storage within a single SRAM to another due to variations in circuit characteristics resulting from fabrication technology and/or the age of the integrated circuit device. The minimum voltage level may also vary due to environmental conditions specific to the data storage circuitry at a particular point in time, such as temperature.

Figure 1B:
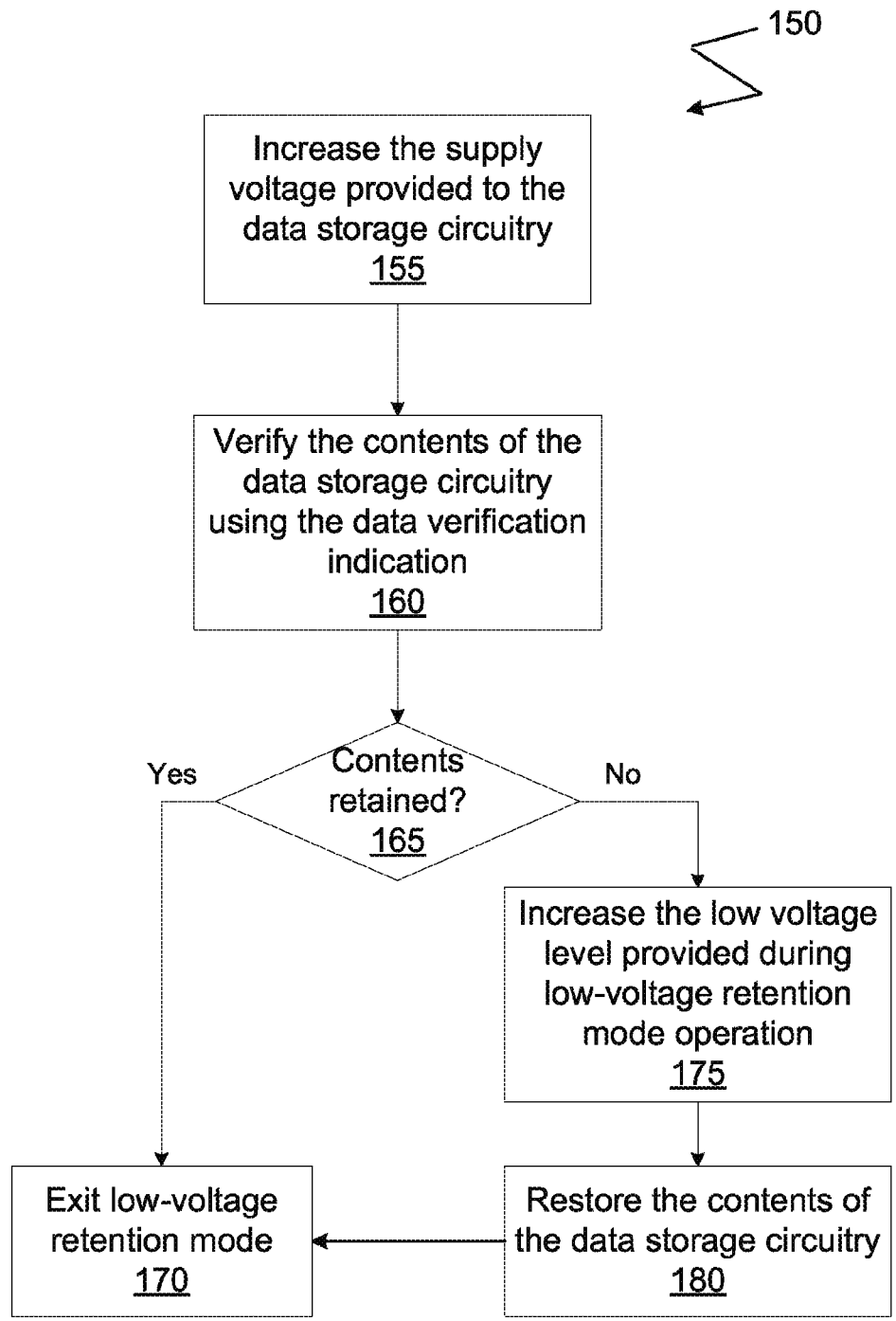
FIG. 1B illustrates a flowchart of a method for exiting a low-voltage retention mode, in accordance with one embodiment.

FIG. 1B illustrates a flowchart of a method 150 for exiting a low-voltage retention mode, in accordance with one embodiment. At step 155, the supply voltage provided to the data storage circuitry is increased to the normal operating voltage level, i.e., the power supply voltage is restored. At step 160, the contents of the data storage circuitry are verified using the data verification indication. A result of the verification indicates whether the contents of the data storage circuitry were retained during the time when the supply voltage provided to the data storage circuitry was at the low voltage level. If, at step 165, the result indicates that the contents of the data storage circuitry were retained, then, at step 170, exiting of the low-voltage retention mode is performed. Otherwise, at step 175, the low voltage level that is provided to the data storage circuitry during a low-voltage retention mode is increased. The amount by which the low voltage level applied during the low-voltage retention mode is increased may vary depending on the result of the verification or results of the verification for multiple periods of the low-voltage retention mode. The amount by which the low voltage level is increased may be fixed or programmable.

At step 180, the contents of the data storage circuitry are restored before proceeding to step 170. The contents may be restored based on a combination of the data verification indication and the current contents of the data storage circuitry that differ compared with the contents of the data storage circuitry prior to the start of the low-voltage retention mode. Restoration of the contents may be performed by either software or circuitry.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2A:
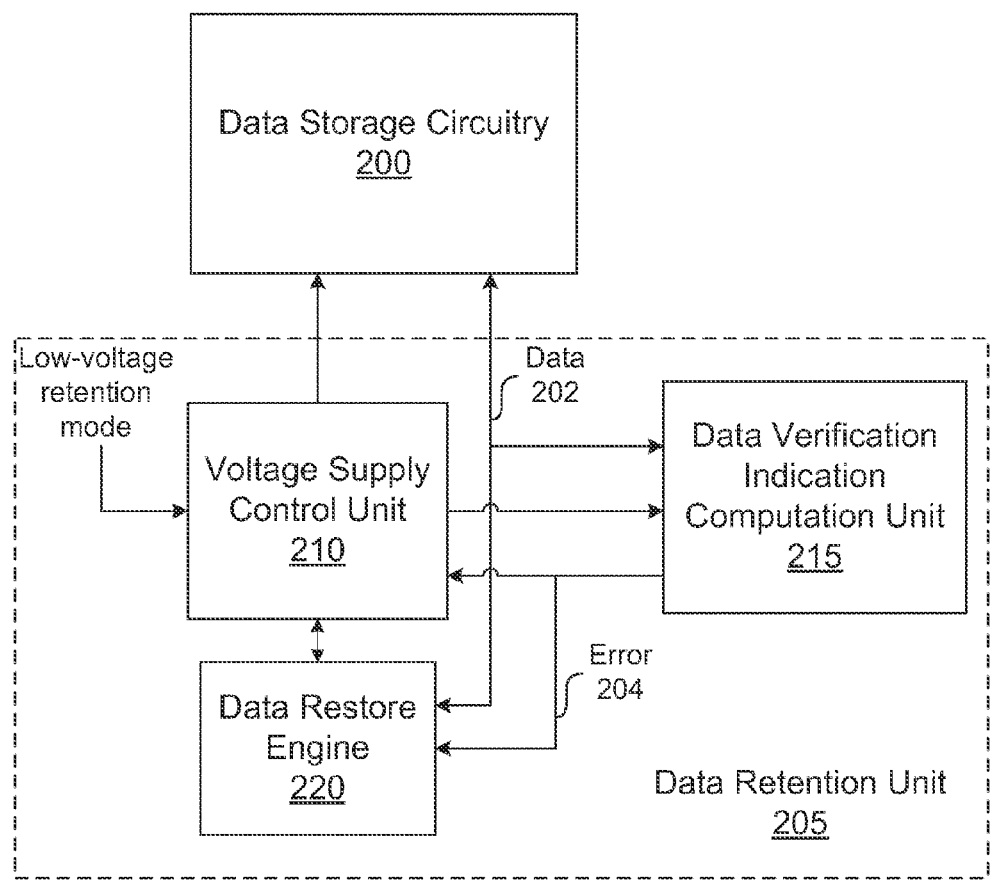
FIG. 2A illustrates data storage circuitry and a data retention unit, in accordance with one embodiment.

FIG. 2A illustrates data storage circuitry 200 and a data retention unit 205, in accordance with one embodiment. The data retention unit 205 includes a voltage supply control unit 210, a data verification indication computation unit 215, and a data restore engine 220. The data storage circuitry 200 may be implemented using SRAM, flip-flops, or other types of circuitry configured to store data values. The data storage circuitry 200 may be configured to perform built-in self-test operations and/or may include registers configurable in a scan chain for performing test operations. The data storage circuitry 200 may be provided at least two different supply voltage levels, e.g., a normal operating voltage level and a low voltage level. When the data storage circuitry 200 is provided with the normal operating voltage level the data written to the data storage circuitry 200 is retained. The low voltage level is provided to the data storage circuitry 200 during periods when a low-voltage retention mode is used. The low voltage level is less or equal to than a minimum normal operating voltage level and may be adjusted to ensure that the contents of the data storage circuitry 200 are retained during the periods when the low-voltage retention mode is used. In one embodiment, the low voltage level is tuned to equal or approximate the minimum voltage level for which the entire contents of the data storage circuitry 200 are retained.

When a low-voltage retention mode is initiated, i.e., the low-voltage retention mode input signal to the voltage supply control unit 210 is asserted, the data retention unit 205 reads the contents of the data storage circuitry 200. In one embodiment, the voltage supply control unit 210 walks through the addresses of the data storage circuitry 200 in sequence to read the entire contents of the data storage circuitry 200. The contents are provided by the data storage circuitry 200 to the data verification indication computation unit 215 via the data 202 connection. The data verification indication computation unit 215 is configured, by the voltage supply control unit 210, to compute the data verification indication corresponding to the contents. Computation of the data verification indication may occur in parallel with reading of the contents from the data storage circuitry 200. When multiple data storage circuitries 200 are instantiated within an integrated circuit, data verification indications may be computed in parallel for one or more of the multiple data storage circuitries 200.

When computation of the data verification indication is completed, the voltage supply control unit 210 configures the data storage circuitry 200 to use the low voltage level instead of the normal operating voltage level. The low voltage level is set to a value that is intended to cause the content of the data storage circuitry 200 to be retained. However, when the low voltage level is used, there is a risk that the contents will not be retained and one or more bits of the contents may be inverted, e.g., a "0" becomes a "1" or vice versa. The data verification indication may be used to determine whether the contents have been retained by the data storage circuitry 200 following a period of the low-voltage retention mode operation.

When a low-voltage retention mode is exited, i.e., the low-voltage retention mode input signal to the voltage supply control unit 210 is negated, the voltage supply control unit 210 configures the data storage circuitry 200 to use the normal operating voltage level instead of the low voltage level. Then, the data retention unit 205 reads the contents of the data storage circuitry 200. The contents are provided by the data storage circuitry 200 to the data verification indication computation unit 215 via the data 202 connection. The data verification indication computation unit 215 is configured by the voltage supply control unit 210 to verify the contents using the data verification indication. The data verification indication computation unit 215 generates a result indicating whether an error is detected, meaning that the current contents of the data storage circuitry 200 are different compared with the contents of the data storage circuitry 200 prior to the reduction of the supply voltage to the low voltage level during a period of low-voltage retention mode operation. The data verification indication computation unit 215 provides the result to the voltage supply control unit 210 and the data restore engine 220 via the error 204 connection.

When the result indicates that the contents of the data storage circuitry 200 were retained correctly, the voltage supply control unit 210 may adjust the low voltage level by decreasing the low voltage level. In one embodiment, the voltage supply control unit 210 may decrease the low voltage level based on results received for multiple periods of low-voltage retention mode operation. Reducing the low voltage level further decreases the power consumed by the data storage circuitry 200 during periods of low-voltage retention mode operation.

When the result indicates that the contents of the data storage circuitry 200 were not retained, the voltage supply control unit 210 may adjust the low voltage level by increasing the low voltage level. The amount by which the low voltage level is increased may be predetermined, programmed, or dynamically determined by the voltage supply control unit 210. The voltage supply control unit 210 may determine the adjustment amount based on the results received for multiple periods of low voltage mode operation, the number of errors indicated by the result, environmental conditions, or the like.

By adjusting the low voltage level, the voltage supply control unit 210 dynamically tunes the supply voltage used during low-voltage retention modes to retain the contents of storage circuitry. In one embodiment, the contents of the data storage circuitry 200 are not saved to or restored from external memory. The data verification indication may be efficiently computed and stored within the same integrated circuit that contains the data storage circuitry 200 and one or more sub-units within the data retention unit 205.

When the result indicates an error, i.e., that the contents of the data storage circuitry 200 were not retained, the data restore engine 220 may be configured to restore the contents of the data storage circuitry 200 using the current contents of the data storage circuitry 200 and the data verification indication. The data restore engine 220 may be implemented as software, firmware, or circuitry. In one embodiment, when an error is indicated, a reboot of the system that includes the data storage circuitry 200 is enforced and the low voltage level may be adjusted to a higher value.

Figure 2B:
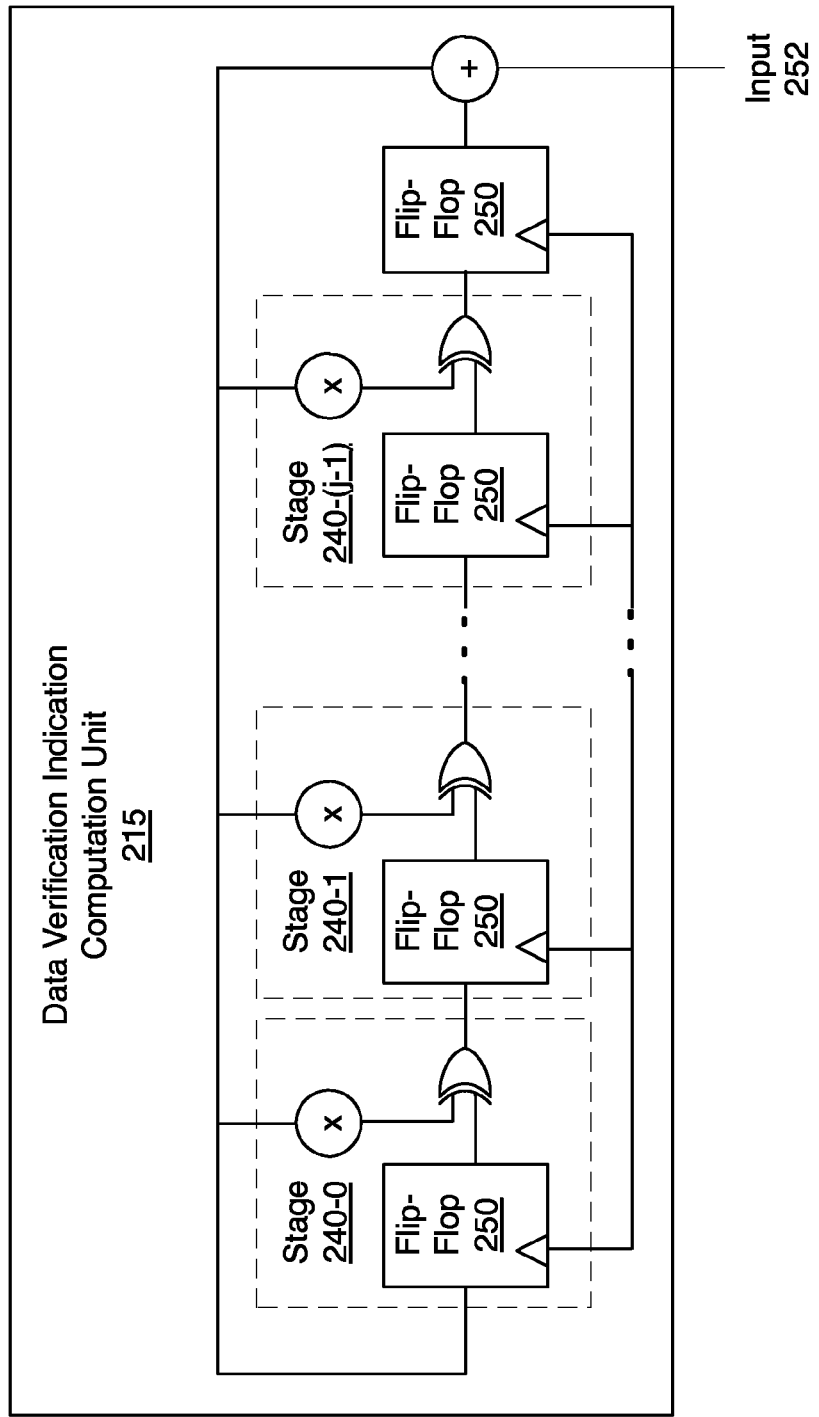
FIG. 2B illustrates at least a portion of the data retention unit of FIG. 2A, in accordance with one embodiment.

FIG. 2B illustrates at least a portion of the data retention unit 205 of FIG. 2A, in accordance with one embodiment. In particular, FIG. 2B illustrates at least a portion of the data verification indication computation unit 215 embodied as a linear feedback shift register (LFSR). Each stage 240 of the LFSR includes a flip-flop 250, an exclusive OR gate (XOR), and a two input multiplier. A second input to the multiplier (not shown) is either a 1 or 0 from a set of coefficients corresponding to each term of a generator polynomial. In one embodiment, the multipliers having a second input that is 1 are replaced with wires and the multipliers having a second input that is 0 are omitted. The feedback network performs division of a message polynomial by the generator polynomial to generate an error detection code that may be used as the data verification indication. The number of flip-flops 250 equals the number of checkbits (j) in the error detection code. The number of checkbits may depend on the number of errors that can be detected and/or corrected. In one embodiment, in order to detect and/or correct t errors, $j=\log_2(k+1)*t$. For example, when the data storage circuitry 200 is an SRAM configured to store k=32 kbits, 75 checkbits are needed to detect and/or correct up to t=5 errors.

The bits read from the data storage circuitry 200 are input to the LFSR at the input 250, and after k cycles the contents of the flip-flops 250 represent the checkbits. The checkbits are a data verification indication that may be computed by the data verification indication computation unit 215. In one embodiment, the LFSR is unrolled to match the word size of the data storage circuitry 200 so that each word read from the data storage circuitry 200 may be input to the LFSR at the input 252. For an example of LFSR unrolling see, R. Micheloni, R. Ravasio, A. Marelli, E. Alice, V. Altieri, A. Bovino, L. Crippa, E. Di Martino, L. D'Onofrio, A. Gambardella, E. Grillea, G. Guerra, D. Kim, C. Missiroli, I. Motta, A. Prisco, G. Ragone, M. Romano, M. Sangalli, P. Sauro, M. Scotti, and S. Won, "A 4 Gb 2b/cell NAND Flash Memory with Embedded 5b BCH ECC for 36 MB/s System Read Throughput," presented at the Solid-State Circuits Conference, 2006. ISSCC 2006. *Digest of Technical Papers. IEEE International*, 2006, pp. 497-506, which is hereby incorporated by reference in its entirety. In one embodiment, a Bose, Chaudhuri, and Hocquenghem (BCH) error code is generated by the data verification indication computation unit 215 as the data verification indication. See, for example, Hocquenghem, A. (September 1959), "Codes correcteurs d'erreurs" (in French), *Chiffres* (Paris) 2: 147-156 and Bose, R. C.; Ray-Chaudhuri, D. K. (March 1960), "On A Class of Error Correcting Binary Group Codes", *Information and Control* 3 (1): 68-79, which are hereby incorporated by reference in their entirety.

The data verification indication computation unit 215 may be configured to store the data verification indication in the flip-flops 250 during the period of low-voltage retention mode operation. The data verification indication should be stored in a reliable storage resource. If the flip-flops within the data verification indication computation unit 215 are not configured to retain their contents during the low-voltage retention mode, then the contents of the flip-flops 250 may be saved to a reliable storage resource prior to entering the low-voltage retention mode and restored to the flip-flops 250 after exiting the low-voltage retention mode.

In one embodiment, the flip-flops 250 that compute and/or store the data verification indication are also used to store patterns needed when built-in self-test operations are performed on the data storage circuitry 200. Although built-in self-test circuitry may be used to verify whether data storage and/or retention has failed, the contents of the data storage circuitry 200 are destroyed when built-in self-test operations are performed. Therefore, some restore mechanism is needed when built-in self-test operations are used and the contents are needed following the built-in self-test operations.

When the data verification indication computation unit 215 is configured to perform verification of the current contents of the data storage circuitry 200, the bits read from the data storage circuitry 200 are input to the LFSR at the input 252. Note that when the data verification indication is stored in the flip-flops 250 within the verification indication computation unit 215 and retained during the low-voltage retention mode and therefore, does not need to be input to the LFSR at the input 252. The value stored in the flip-flops 250 after the bits read from the data storage circuitry 200 are input to the LFSR represents a verification result indicating whether or not the contents of the data storage circuitry 200 were retained.

In one embodiment, the data verification indication is stored in a reliable storage resource and is read from the reliable storage resource and input at the input 252 before or after the bits that are read from the data storage circuitry 200. The value stored in the flip-flops 250 after the data verification indication and the bits read from the data storage circuitry 200 are input to the LFSR represents a verification result indicating whether or not the contents of the data storage circuitry 200 were retained.

In one embodiment, when all bits of the verification result equal zero, then no error occurred and the contents of the data storage circuitry 200 were retained. When one or more bits equal one instead of zero, Berlekamp and Chien algorithms may be used by the data verification indication computation unit 215 to correct the contents, i.e., restore the contents. See, for example, Berlekamp, Elwyn R. (1967). "Factoring Polynomials Over Finite Fields". *Bell System Technical Journal* 46: 1853-1859, which is hereby incorporated by reference in its entirety. See, for example, Chien, R. T. (October 1964), "Cyclic Decoding Procedures for the Bose-Chaudhuri-Hocquenghem Codes", *IEEE Transactions on Information Theory* IT-10 (4): 357-363, which is hereby incorporated by reference in its entirety.

Figure 3A:
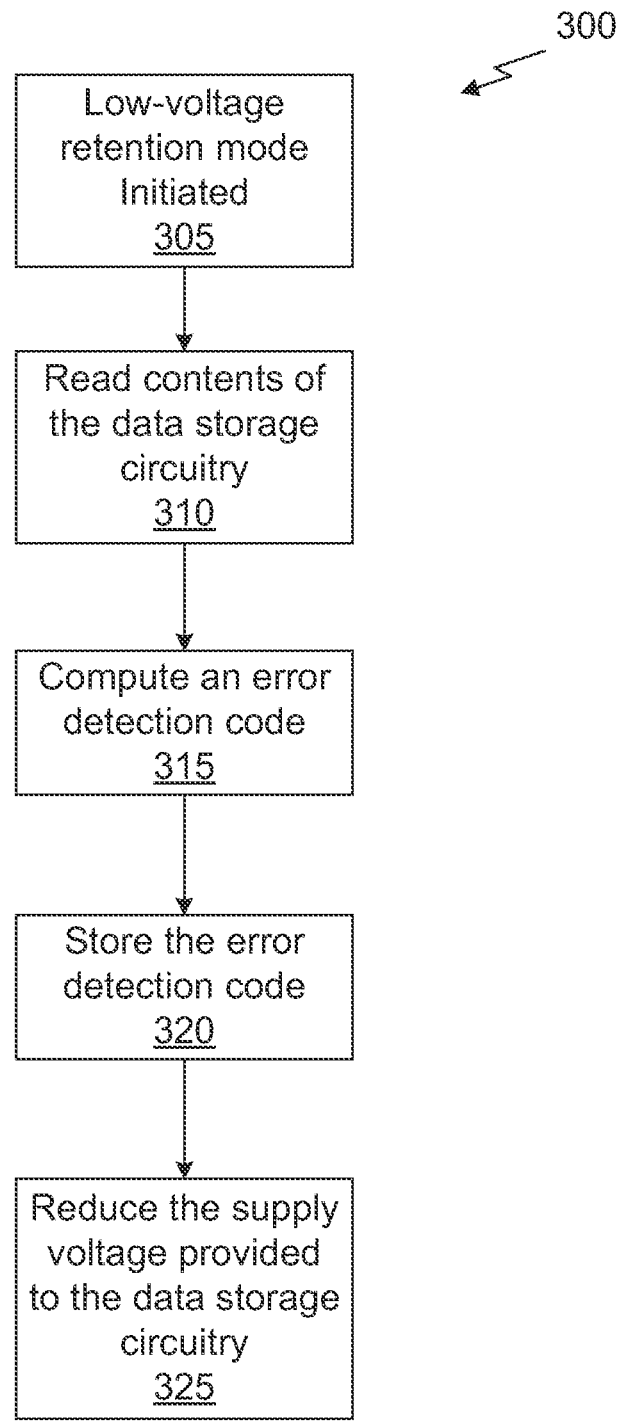
FIG. 3A illustrates a flowchart of another method for entering a low-voltage retention mode, in accordance with one embodiment.

FIG. 3A illustrates a flowchart of another method 300 for entering a low-voltage retention mode, in accordance with one embodiment. At step 305, low-voltage retention mode operation is initiated. At step 310, the contents of the data storage circuitry are read by the data retention unit 205. At step 315, an error detection code corresponding to the contents is computed by the data retention unit 205. At step 320, the error detection code is stored either in the flip-flops 250 within the verification indication computation unit 215 or a reliable storage resource. Then, at step 325, the supply voltage provided to the data storage circuitry is reduced to a low voltage level that is intended to retain the contents of the data storage circuitry.

Figure 3B:
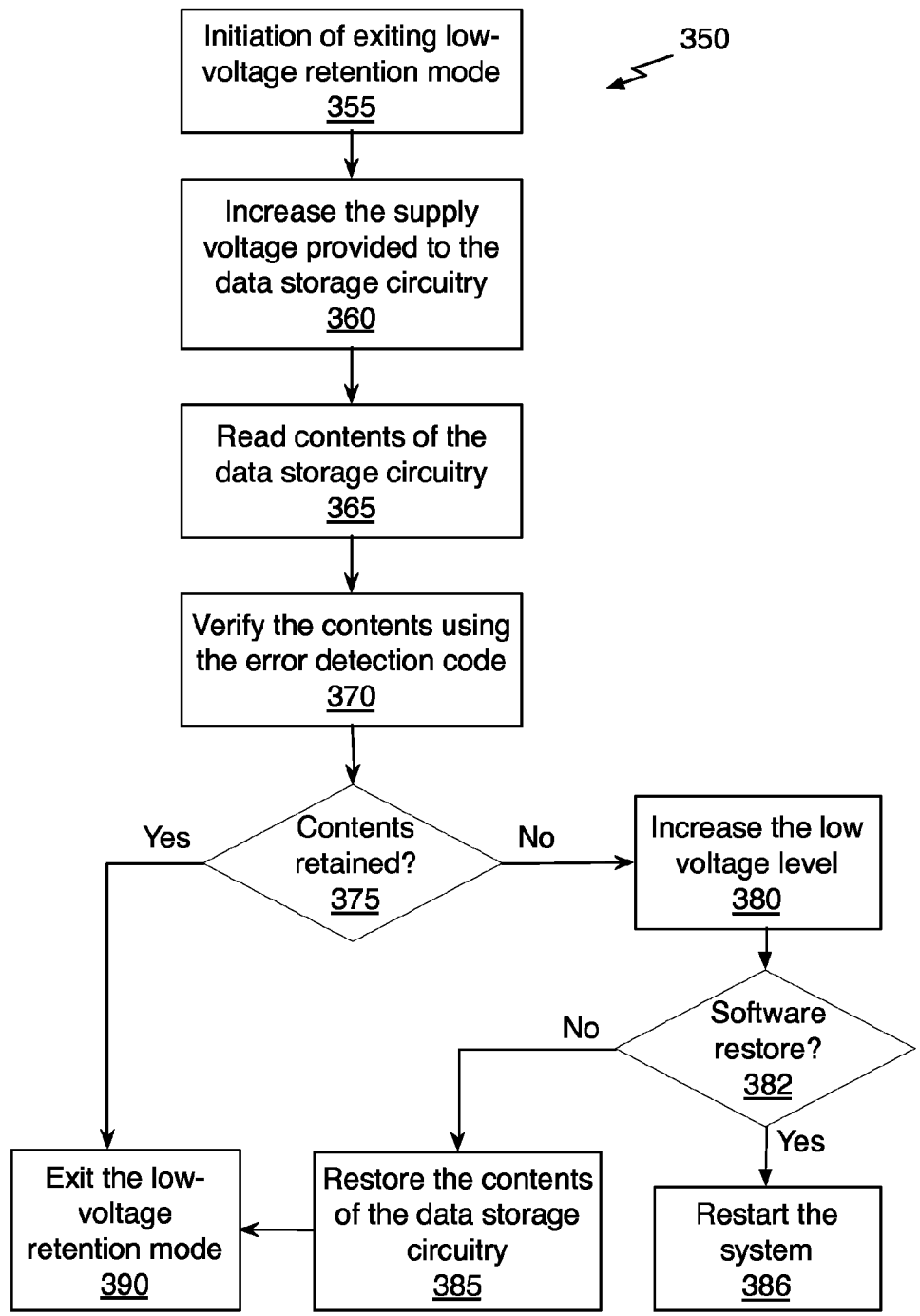
FIG. 3B illustrates a flowchart of another method for exiting a low-voltage retention mode, in accordance with one embodiment.

FIG. 3B illustrates a flowchart of another method 350 for exiting a low-voltage retention mode, in accordance with one embodiment. At step 355, exiting of the low-voltage retention mode operation is initiated. At step 360, the supply voltage provided to the data storage circuitry is increased to the normal operating level, i.e., the power supply voltage is restored. At step 365, the contents of the data storage circuitry are read by the data retention unit 205.

At step 370, the contents of the data storage circuitry are verified by the data retention unit 205 using the stored error detection code. A result of the verification indicates whether the contents of the data storage circuitry were retained during the time when the supply voltage provided to the data storage circuitry was at the low voltage level. If, at step 375, the result indicates that the contents of the data storage circuitry were retained, then at step 390 exiting of the low-voltage retention mode is performed. Otherwise, at step 380, the data retention unit 205 increases the low voltage level that is provided to the data storage circuitry 200 during low-voltage retention mode operation. Restoration of the contents may be performed by either software (including firmware) or circuitry.

At step 382, if the data restore engine 220 is not included in the data retention unit 205 or the data retention unit 205 is not otherwise configured to restore the contents of the data storage circuitry, then the restore operation is performed by software and/or firmware. At step 386, the system including the data storage circuitry 200 is restarted, if necessary, and software performs the restore operation. Otherwise, at step 385, the contents of the data storage circuitry 200 are restored by the data retention unit 205 before proceeding to step 390. At step 390 the low-voltage retention mode is exited.

In one example, the data storage circuitry 200 is an SRAM configured to store 2048 bits and the SRAM operates at 500 MHz. Computation of the data verification indication may be performed in 4.1 microseconds, allowing the low-voltage retention mode operation to begin in 4.1 microseconds. When the data storage circuitry 200 is instantiated within a graphics processor, the graphics processor may enter and exit the low-voltage retention mode operation after each frame is rendered. For example, at 60 Hz frame rates, the graphics processor has 16.67 milliseconds to render each frame. When rendering is completed in a few milliseconds or less, or even several milliseconds, the graphics processor may operate in the low-voltage retention mode to conserve power. The data storage circuitry 200 within the graphics processor may be configured to use a low voltage level during the periods of low-voltage retention mode operation, because the entry and exit latency for the low-voltage retention mode operation is short in comparison with the time available to render the frames. Instantiations of data storage circuitry 200 within an integrated circuit such as a processor, or more specifically, a graphics processor may include caches and register files. An example of a parallel processing unit (PPU) that may include one or more instances of data storage circuitry 200 and associated data retention units 205 is described in further detail. The PPU may be configured to operate in a low-voltage retention mode.

Figure 4:
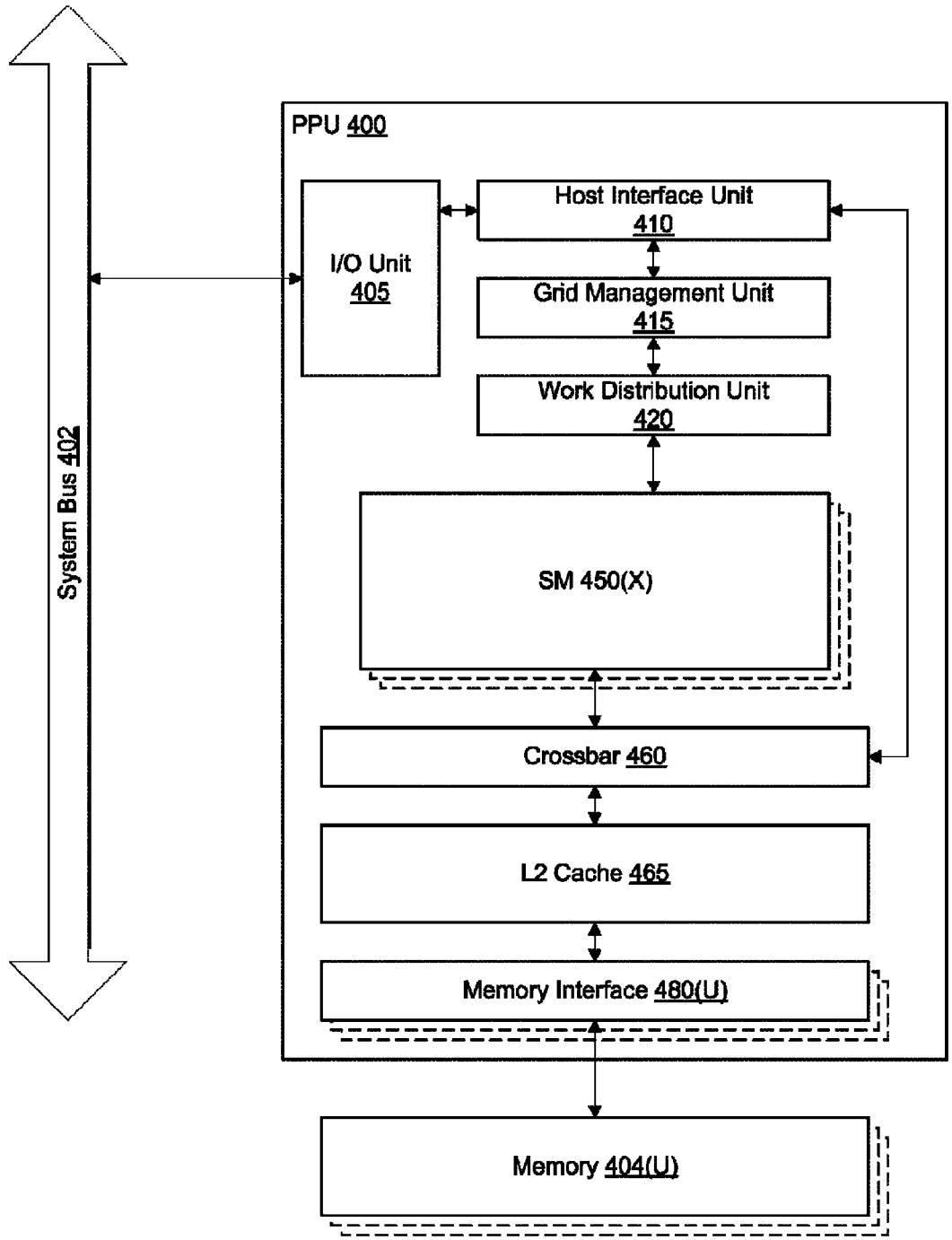
FIG. 4 illustrates a parallel processing unit, in accordance with one embodiment.

FIG. 4 illustrates a PPU 400, according to one embodiment in which the various architecture and/or functionality of the various previous embodiments may be implemented. While a parallel processor is provided herein as an example of the PPU 400, it should be strongly noted that such processor is set forth for illustrative purposes only, and any processor may be employed to supplement and/or substitute for the same. In one embodiment, the PPU 400 is configured to execute a plurality of threads concurrently in two or more streaming multi-processors (SMs) 450. A thread (i.e., a thread of execution) is an instantiation of a set of instructions executing within a particular SM 450. Each SM 450, described below in more detail in conjunction with FIG. 5, may include, but is not limited to, one or more processing cores, one or more load/store units (LSUs), a level-one (L1) cache, shared memory, and the like.

In one embodiment, the PPU 400 includes an input/output (I/O) unit 405 configured to transmit and receive communications (i.e., commands, data, etc.) from a central processing unit (CPU) (not shown) over the system bus 402. The I/O unit 405 may implement a Peripheral Component Interconnect Express (PCIe) interface for communications over a PCIe bus. In alternative embodiments, the I/O unit 405 may implement other types of well-known bus interfaces.

The PPU 400 also includes a host interface unit 410 that decodes the commands and transmits the commands to the grid management unit 415 or other units of the PPU 400 (e.g., memory interface 480) as the commands may specify. The host interface unit 410 is configured to route communications between and among the various logical units of the PPU 400.

In one embodiment, a program encoded as a command stream is written to a buffer by the CPU. The buffer is a region in memory, e.g., memory 404 or system memory, that is accessible (i.e., read/write) by both the CPU and the PPU 400. The CPU writes the command stream to the buffer and then transmits a pointer to the start of the command stream to the PPU 400. The host interface unit 410 provides the grid management unit (GMU) 415 with pointers to one or more streams. The GMU 415 selects one or more streams and is configured to organize the selected streams as a pool of pending grids. The pool of pending grids may include new grids that have not yet been selected for execution and grids that have been partially executed and have been suspended.

A work distribution unit 420 that is coupled between the GMU 415 and the SMs 450 manages a pool of active grids, selecting and dispatching active grids for execution by the SMs 450. Pending grids are transferred to the active grid pool by the GMU 415 when a pending grid is eligible to execute, i.e., has no unresolved data dependencies. An active grid is transferred to the pending pool when execution of the active grid is blocked by a dependency. When execution of a grid is completed, the grid is removed from the active grid pool by the work distribution unit 420. In addition to receiving grids from the host interface unit 410 and the work distribution unit 420, the GMU 410 also receives grids that are dynamically generated by the SMs 450 during execution of a grid. These dynamically generated grids join the other pending grids in the pending grid pool.

In one embodiment, the CPU executes a driver kernel that implements an application programming interface (API) that enables one or more applications executing on the CPU to schedule operations for execution on the PPU 400. An application may include instructions (i.e., API calls) that cause the driver kernel to generate one or more grids for execution. In one embodiment, the PPU 400 implements a SIMD (Single-Instruction, Multiple-Data) architecture where each thread block (i.e., warp) in a grid is concurrently executed on a different data set by different threads in the thread block. The driver kernel defines thread blocks that are comprised of k related threads, such that threads in the same thread block may exchange data through shared memory. In one embodiment, a thread block comprises 32 related threads and a grid is an array of one or more thread blocks that execute the same stream and the different thread blocks may exchange data through global memory.

In one embodiment, the PPU 400 comprises X SMs 450 (X). For example, the PPU 400 may include 15 distinct SMs 450. Each SM 450 is multi-threaded and configured to execute a plurality of threads (e.g., 32 threads) from a particular thread block concurrently. Each of the SMs 450 is connected to a level-two (L2) cache 465 via a crossbar 460 (or other type of interconnect network). The L2 cache 465 is connected to one or more memory interfaces 480. Memory interfaces 480 implement 16, 32, 64, 128-bit data buses, or the like, for high-speed data transfer. In one embodiment, the PPU 400 comprises U memory interfaces 480(U), where each memory interface 480(U) is connected to a corresponding memory device 404(U). For example, PPU 400 may be connected to up to 6 memory devices 404, such as graphics double-data-rate, version 5, synchronous dynamic random access memory (GDDR5 SDRAM).

In one embodiment, the PPU 400 implements a multi-level memory hierarchy. The memory 404 is located off-chip in SDRAM coupled to the PPU 400. Data from the memory 404 may be fetched and stored in the L2 cache 465, which is located on-chip and is shared between the various SMs 450. In one embodiment, each of the SMs 450 also implements an L1 cache. The L1 cache is private memory that is dedicated to a particular SM 450. Each of the L1 caches is coupled to the shared L2 cache 465. Data from the L2 cache 465 may be fetched and stored in each of the L1 caches for processing in the functional units of the SMs 450.

In one embodiment, the PPU 400 comprises a graphics processing unit (GPU). The PPU 400 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The PPU 400 can be configured to process the graphics primitives to generate a frame buffer (i.e., pixel data for each of the pixels of the display). The driver kernel implements a graphics processing pipeline, such as the graphics processing pipeline defined by the OpenGL API.

An application writes model data for a scene (i.e., a collection of vertices and attributes) to memory. The model data defines each of the objects that may be visible on a display. The application then makes an API call to the driver kernel that requests the model data to be rendered and displayed. The driver kernel reads the model data and writes commands to the buffer to perform one or more operations to process the model data. The commands may encode different shader programs including one or more of a vertex shader, hull shader, geometry shader, pixel shader, etc. For example, the GMU 415 may configure one or more SMs 450 to execute a vertex shader program that processes a number of vertices defined by the model data. In one embodiment, the GMU 415 may configure different SMs 450 to execute different shader programs concurrently. For example, a first subset of SMs 450 may be configured to execute a vertex shader program while a second subset of SMs 450 may be configured to execute a pixel shader program. The first subset of SMs 450 processes vertex data to produce processed vertex data and writes the processed vertex data to the L2 cache 465 and/or the memory 404. After the processed vertex data is rasterized (i.e., transformed from three-dimensional data into two-dimensional data in screen space) to produce fragment data, the second subset of SMs 450 executes a pixel shader to produce processed fragment data, which is then blended with other processed fragment data and written to the frame buffer in memory 404. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

The PPU 400 may be included in a desktop computer, a laptop computer, a tablet computer, a smart-phone (e.g., a wireless, hand-held device), personal digital assistant (PDA), a digital camera, a hand-held electronic device, and the like. In one embodiment, the PPU 400 is embodied on a single semiconductor substrate. In another embodiment, the PPU 400 is included in a system-on-a-chip (SoC) along with one or more other logic units such as a reduced instruction set computer (RISC) CPU, a memory management unit (MMU), a digital-to-analog converter (DAC), and the like.

In one embodiment, the PPU 400 may be included on a graphics card that includes one or more memory devices 404 such as GDDR5 SDRAM. The graphics card may be configured to interface with a PCIe slot on a motherboard of a desktop computer that includes, e.g., a northbridge chipset and a southbridge chipset. In yet another embodiment, the PPU 400 may be an integrated graphics processing unit (iGPU) included in the chipset (i.e., Northbridge) of the motherboard.

Figure 5:
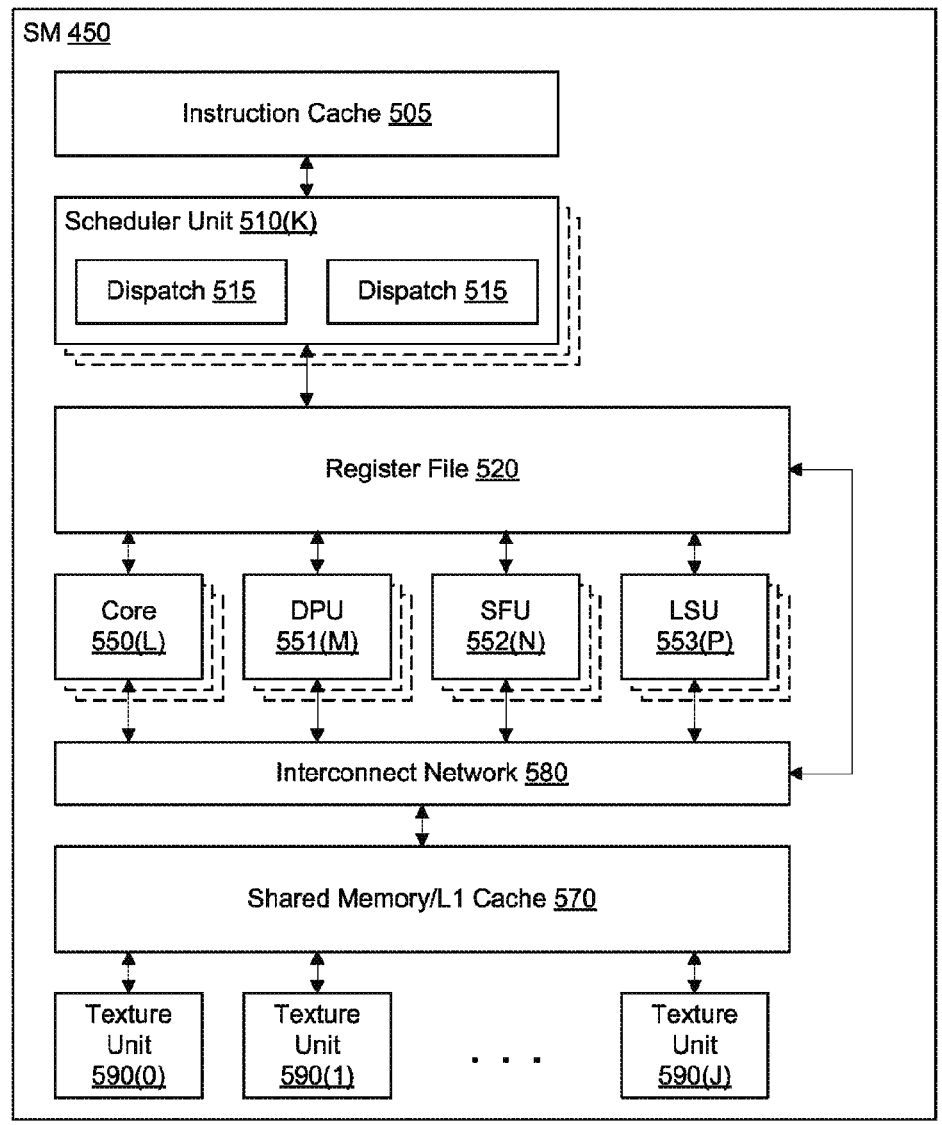
FIG. 5 illustrates the streaming multi-processor of FIG. 4, in accordance with one embodiment.

FIG. 5 illustrates the streaming multi-processor 450 of FIG. 4, according to one embodiment. As shown in FIG. 5, the SM 450 includes an instruction cache 505, one or more scheduler units 510, a register file 520, one or more processing cores 550, one or more double precision units (DPUs) 551, one or more special function units (SFUs) 552, one or more load/store units (LSUs) 553, an interconnect network 580, a shared memory/L1 cache 570, and one or more texture units 590.

As described above, the work distribution unit 420 dispatches active grids for execution on one or more SMs 450 of the PPU 400. The scheduler unit 510 receives the grids from the work distribution unit 420 and manages instruction scheduling for one or more thread blocks of each active grid. The scheduler unit 510 schedules threads for execution in groups of parallel threads, where each group is called a warp. In one embodiment, each warp includes 32 threads. The scheduler unit 510 may manage a plurality of different thread blocks, allocating the thread blocks to warps for execution and then scheduling instructions from the plurality of different warps on the various functional units (i.e., cores 550, DPUs 551, SFUs 552, and LSUs 553) during each clock cycle.

In one embodiment, each scheduler unit 510 includes one or more instruction dispatch units 515. Each dispatch unit 515 is configured to transmit instructions to one or more of the functional units. In the embodiment shown in FIG. 5, the scheduler unit 510 includes two dispatch units 515 that enable two different instructions from the same warp to be dispatched during each clock cycle. In alternative embodiments, each scheduler unit 510 may include a single dispatch unit 515 or additional dispatch units 515.

Each SM 450 includes a register file 520 that provides a set of registers for the functional units of the SM 450. In one embodiment, the register file 520 is divided between each of the functional units such that each functional unit is allocated a dedicated portion of the register file 520. In another embodiment, the register file 520 is divided between the different warps being executed by the SM 450. The register file 520 provides temporary storage for operands connected to the data paths of the functional units.

Each SM 450 comprises L processing cores 550. In one embodiment, the SM 450 includes a large number (e.g., 192, etc.) of distinct processing cores 550. Each core 550 is a fully-pipelined, single-precision processing unit that includes a floating point arithmetic logic unit and an integer arithmetic logic unit. In one embodiment, the floating point arithmetic logic units implement the IEEE 754-2008 standard for floating point arithmetic. Each SM 450 also comprises M DPUs 551 that implement double-precision floating point arithmetic, N SFUs 552 that perform special functions (e.g., copy rectangle, pixel blending operations, and the like), and P LSUs 553 that implement load and store operations between the shared memory/L1 cache 570 and the register file 520. In one embodiment, the SM 450 includes 64 DPUs 551, 32 SFUs 552, and 32 LSUs 553.

Each SM 450 includes an interconnect network 580 that connects each of the functional units to the register file 520 and the shared memory/L1 cache 570. In one embodiment, the interconnect network 580 is a crossbar that can be configured to connect any of the functional units to any of the registers in the register file 520 or the memory locations in shared memory/L1 cache 570.

In one embodiment, the SM 450 is implemented within a GPU. In such an embodiment, the SM 450 comprises J texture units 590. The texture units 590 are configured to load texture maps (i.e., a 2D array of texels) from the memory 404 and sample the texture maps to produce sampled texture values for use in shader programs. The texture units 590 implement texture operations such as anti-aliasing operations using mipmaps (i.e., texture maps of varying levels of detail). In one embodiment, the SM 450 includes 16 texture units 590.

The PPU 400 described above may be configured to perform highly parallel computations much faster than conventional CPUs. Parallel computing has advantages in graphics processing, data compression, biometrics, stream processing algorithms, and the like.

Figure 6:
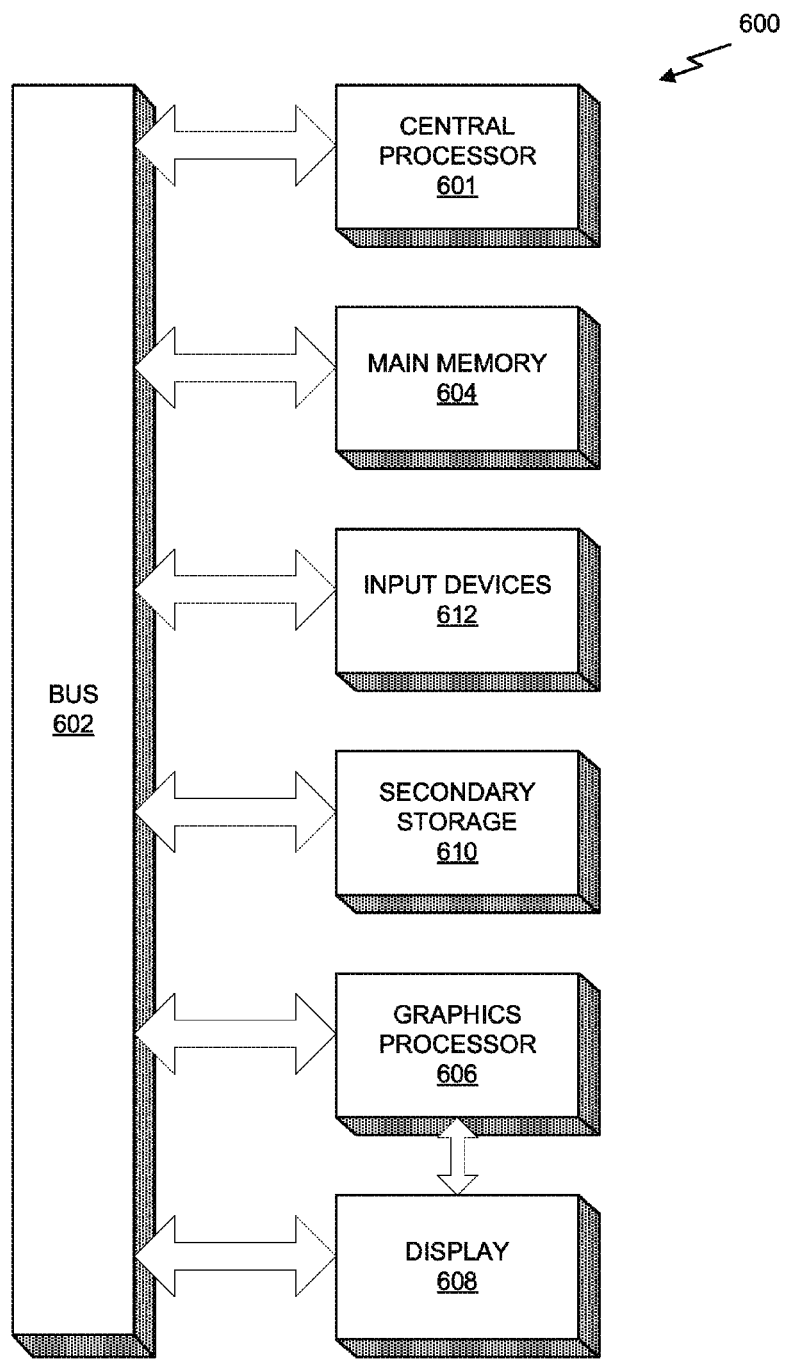
FIG. 6 illustrates an exemplary system in which the various architecture and/or functionality of the various previous embodiments may be implemented.

FIG. 6 illustrates an exemplary system 600 in which the various architecture and/or functionality of the various previous embodiments may be implemented. As shown, a system 600 is provided including at least one central processor 601 that is connected to a communication bus 602. The communication bus 602 may be implemented using any suitable protocol, such as PCI (Peripheral Component Interconnect), PCI-Express, AGP (Accelerated Graphics Port), HyperTransport, or any other bus or point-to-point communication protocol(s). The system 600 also includes a main memory 604. Control logic (software) and data are stored in the main memory 604 which may take the form of random access memory (RAM).

The system 600 also includes input devices 612, a graphics processor 606, and a display 608, i.e. a conventional CRT (cathode ray tube), LCD (liquid crystal display), LED (light emitting diode), plasma display or the like. User input may be received from the input devices 612, e.g., keyboard, mouse, touchpad, microphone, and the like. In one embodiment, the graphics processor 606 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 600 may also include a secondary storage 610. The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 604 and/or the secondary storage 610. Such computer programs, when executed, enable the system 600 to perform various functions. The memory 604, the storage 610, and/or any other storage are possible examples of computer-readable media.

In one embodiment, the architecture and/or functionality of the various previous figures may be implemented in the context of the central processor 601, the graphics processor 606, an integrated circuit (not shown) that is capable of at least a portion of the capabilities of both the central processor 601 and the graphics processor 606, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 600 may take the form of a desktop computer, laptop computer, server, workstation, game consoles, embedded system, and/or any other type of logic. Still yet, the system 600 may take the form of various other devices including, but not limited to a personal digital assistant (PDA) device, a mobile phone device, a television, etc.

Further, while not shown, the system 600 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method comprising:
 reading, by a data retention circuit, contents of a data storage circuit;
 computing, by the data retention circuit, a data verification indication corresponding to the contents;
 reducing, by the data retention circuit, a supply voltage provided to the data storage circuit to a low voltage level intended to retain the contents of the data storage circuit; and
 increasing, by the data retention circuit, the low voltage level after determining, based on the data verification indication, that the contents of the data storage circuit were not retained.

2. The method of claim 1, further comprising:
 increasing, by the data retention circuit, the supply voltage provided to the data storage circuit to a normal operating voltage level; and
 verifying, by the data retention circuit, the contents of the data storage circuit using the data verification indication.

3. The method of claim 1, further comprising restoring the contents of the data storage circuit after determining, based on the data verification indication, that the contents of the data storage circuit were not retained.

4. The method of claim 3, wherein the restoring of the contents of the data storage circuit is accomplished based on the data verification indication and current contents of the data storage circuit that are different compared with the contents of the data storage circuit prior to the reducing of the supply voltage to the low voltage level.

5. The method of claim 2, further comprising decreasing, by the data retention circuit, the low voltage level after determining that the contents of the data storage circuit were retained.

6. The method of claim 1, wherein the data verification indication is computed using a linear feedback shift register.

7. The method of claim 1, further comprising storing the data verification indication in built-in self-test registers associated with the data storage circuit.

8. The method of claim 1, wherein a size of the data verification indication, in bits, is smaller than a size of the contents of the data storage circuit.

9. The method of claim 1, further comprising storing the data verification indication in registers within an integrated circuit that also contains the data storage circuit.

10. The method of claim 1, wherein the data storage circuit is a static random access memory (SRAM).

11. The method of claim 1, further comprising adjusting the low voltage based on an environmental factor.

12. An integrated circuit comprising:
a data storage circuit; and
a data retention unit coupled to the data storage circuit and configured to:
read contents of the data storage circuit;
compute a data verification indication corresponding to the contents;
reduce a supply voltage provided to the data storage circuit to a low voltage level intended to retain the contents of the data storage circuitry; and
increase the low voltage level after determining, based on the data verification indication, that the contents of the data storage circuitry were not retained.

13. The integrated circuit of claim 12, wherein the data retention unit is further configured to:
increase the supply voltage provided to the data storage circuit to a normal operating voltage level; and
verify the contents of the data storage circuit using the data verification indication.

14. The integrated circuit of claim 12, further comprising registers configured to store the data verification indication.

15. The integrated circuit of claim 12, wherein a size of the data verification indication, in bits, is smaller than a size of the contents.

16. The integrated circuit of claim 12, wherein the data retention unit is further configured to decrease the low voltage level after determining that the contents of the data storage circuit were retained.

17. The integrated circuit of claim 12, wherein the data retention unit is further configured to restore the contents of the data storage circuit after determining, based on the data verification indication, that the contents of the data storage circuit were not retained.

18. The integrated circuit of claim 12, wherein the data retention unit comprises a linear feedback shift register that is configured to compute the data verification indication.

19. The integrated circuit of claim 12, further comprising built-in self-test registers configured to store the data verification indication.

20. The integrated circuit of claim 12, wherein the data retention unit is further configured to adjust the low voltage based on an environmental factor.

* * * * *

UNITED STATES PATENT AND TRADEMARK OFFICE
CERTIFICATE OF CORRECTION

PATENT NO. : 8,879,350 B2
APPLICATION NO. : 13/672616
DATED : November 4, 2014
INVENTOR(S) : Khailany et al.

Page 1 of 1

It is certified that error appears in the above-identified patent and that said Letters Patent is hereby corrected as shown below:

In the Claims

Column 13, Line 28 please replace "storage circuitand" with --storage circuit and--;
Column 13, Line 34 please replace "circuitto a low" with --circuit to a low--.

Signed and Sealed this
Seventh Day of April, 2020

Andrei Iancu
*Director of the United States Patent and Trademark Office*